(12) United States Patent
Ma

(10) Patent No.: US 12,360,168 B2
(45) Date of Patent: Jul. 15, 2025

(54) VOLTAGE MEASUREMENT CIRCUIT AND METHOD, CIRCUIT BOARD, AND CONTROL MODULE

(71) Applicant: CONTEMPORARY AMPEREX TECHNOLOGY (HONG KONG) LIMITED, Hong Kong (HK)

(72) Inventor: Guobin Ma, Fujian (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 109 days.

(21) Appl. No.: 18/232,839

(22) Filed: Aug. 11, 2023

(65) Prior Publication Data
US 2023/0384385 A1  Nov. 30, 2023

Related U.S. Application Data

(63) Continuation of application No. PCT/CN2021/138783, filed on Dec. 16, 2021.

(51) Int. Cl.
G01R 31/3835 (2019.01)
G01R 31/396 (2019.01)

(52) U.S. Cl.
CPC ....... *G01R 31/3835* (2019.01); *G01R 31/396* (2019.01)

(58) Field of Classification Search
None
See application file for complete search history.

(56) References Cited

U.S. PATENT DOCUMENTS

| 2008/0100266 A1* | 5/2008 | Sobue | H01M 10/482 320/134 |
|---|---|---|---|
| 2010/0060256 A1 | 3/2010 | Ishikawa et al. | |
| 2011/0210747 A1 | 9/2011 | Heo et al. | |

FOREIGN PATENT DOCUMENTS

| CN | 101806866 A | 8/2010 |
|---|---|---|
| CN | 102162834 A | 8/2011 |
| CN | 103562738 A | 2/2014 |

(Continued)

OTHER PUBLICATIONS

Notice of Reasons for Refusal issued Jul. 16, 2024 in Japanese Patent Application No. 2023-546080 with English translation thereof.

(Continued)

*Primary Examiner* — Jas A Sanghera
(74) *Attorney, Agent, or Firm* — XSENSUS LLP

(57) ABSTRACT

A voltage measurement circuit for measuring a voltage output by a battery, the battery comprising n battery cells connected in series, wherein n is an integer greater than 1; and the circuit comprising: n low-voltage measurement modules provided in one-to-one correspondence with the n battery cells, a first switching circuit, a second switching circuit, a reference voltage source, and a control module, wherein the reference voltage source may be used for outputting a preset reference voltage; and the two ends of each of the low-voltage measurement modules may be connected to the two ends of a corresponding one of the battery cells via the first switching circuit, and the two ends of each of the low-voltage measurement modules may be further connected to the two ends of the reference voltage source via the second switching circuit.

17 Claims, 5 Drawing Sheets

(56)     References Cited

FOREIGN PATENT DOCUMENTS

| | | |
|---|---|---|
| CN | 104836261 A | 8/2015 |
| CN | 105896665 A | 8/2016 |
| CN | 107479001 A | 12/2017 |
| JP | 2003-240806 A | 8/2003 |
| JP | 2005-086867 A | 3/2005 |
| JP | 2010-220280 A | 9/2010 |
| JP | 2012-202738 A | 10/2012 |
| JP | 2014-106139 A | 6/2014 |
| JP | 2014-110684 A | 6/2014 |
| JP | 2021-045017 A | 3/2021 |
| WO | 2012/127304 A1 | 9/2012 |

OTHER PUBLICATIONS

Decision to Grant a Patent issued Oct. 8, 2024 in Japanese Patent Application No. 2023-546080 with English translation thereof.
Extended European Search Report issued Nov. 29, 2024 in European Patent Application No. 21967675.6.
Office Action issued Nov. 28, 2024 in Korean Patent Application No. 10-2023-7026493 with machine English translation thereof.
International Search Report and Written Opinion mailed on Aug. 17, 2022, received for PCT Application PCT/CN2021/138783, filed on Dec. 16, 2021, 11 pages including English Translation.

* cited by examiner

US 12,360,168 B2

VOLTAGE MEASUREMENT CIRCUIT AND METHOD, CIRCUIT BOARD, AND CONTROL MODULE

CROSS-REFERENCE TO RELATED APPLICATION

The present application is a continuation of International Application No. PCT/CN2021/138783, filed Dec. 16, 2021, which is incorporated herein by reference in its entirety.

TECHNICAL FIELD

The present application relates to the field of battery technologies, and in particular to a voltage measurement circuit and method, a circuit board, and a control module.

BACKGROUND

In the field of voltage measurement, technicians usually use instruments such as multimeters and voltage measurement instruments to measure voltages, but these conventional measurement instruments cannot balance the range and the precision, and if a large range of voltage is to be measured, it is only possible to be achieved by reducing the measurement precision; and if the measurement precision is to be improved, it is only possible to be achieved by measuring a small range of voltage.

At present, the problem of performing high-precision measurements on a large-range of voltage is in urgent need of solution.

SUMMARY OF THE DISCLOSURE

Embodiments of the present application provide a voltage measurement circuit and method, a circuit board, and a control module, which enable large-range measurement and measurement precision to be balanced.

In a first aspect, embodiments of the present application provides a voltage measurement circuit for measuring a voltage output by a battery, the battery comprising n battery cells connected in series, wherein n is an integer greater than 1; and the circuit comprising: n low-voltage measurement modules provided in one-to-one correspondence with the n battery cells, a first switching circuit, a second switching circuit, a reference voltage source, and a control module, wherein the reference voltage source is used for outputting a preset reference voltage; the two ends of each of the low-voltage measurement modules are connected to the two ends of a corresponding one of the battery cells via the first switching circuit, the two ends of each of the low-voltage measurement modules are further connected to the two ends of the reference voltage source via the second switching circuit, and the control module is connected to switching units in the first switching circuit and the second switching circuit, and the control module is further connected to each of the low-voltage measurement modules; and the control module is used for controlling the switching units to be on or off and acquiring the voltages of the battery cells that are measured by the low-voltage measurement modules.

In the technical solution of embodiments of the present application, since the measurement range of the low-voltage measurement module is small but the measurement precision is high, the voltages across the n battery cells in the battery can be measured by the n low-voltage measurement modules, respectively, and the measured voltages can be summed up as the voltage output by the battery that is obtained through measurement, which not only expands the measurement range of the voltage measurement circuit, but also ensures that the measurement precision of the summed voltage is close to that of the low-voltage measurement module, so that the large-range measurement and the measurement precision can be balanced. In addition, embodiments of the present application can also use a reference voltage source to calibrate each of the low-voltage measurement modules, which can further improve the accuracy of voltage measurement by the measurement device.

In some embodiments, the first switching circuit comprises n+1 first switching units; and n−1 connection nodes formed by series connection of the n low-voltage measurement modules and the two ends of a branch circuit formed by series connection of the n low-voltage measurement modules are used as first connectable nodes, and n−1 connection nodes formed by series connection of the n battery cells and the two ends of a branch circuit formed by series connection of the n battery cells are used as second connectable nodes, the first connectable nodes being separately connected to corresponding ones of the second connectable nodes via the first switching units.

In the above embodiments, a specific circuit structure of the first switching circuit is provided.

In some embodiments, the second switching circuit comprises n+2 second switching units; and n−1 connection nodes formed by series connection of n second switching units and the two ends of a branch circuit formed by series connection of n second switching units are used as third connectable nodes, the first connectable nodes being separately connected to corresponding ones of the third connectable nodes via the second switching units, and the two ends of a branch circuit formed by series connection of the second switching units are further connected to the two ends of the reference voltage source via the second switching units.

In the above embodiments, a specific circuit structure of the second switching circuit is provided.

In some embodiments, the second switching circuit comprises 2n second switching units; and the two ends of each of the n low-voltage measurement modules are connected at the two ends of the reference voltage source via the second switching units.

In the above embodiments, another specific circuit structure of the second switching circuit is provided that allows the voltage across the reference voltage source to be measured by the low-voltage measurement modules simultaneously, thus reducing the time to acquire the error values corresponding to the low-voltage measurement modules.

In some embodiments, the control module is specifically used for controlling switching units in the second switching circuit, so as to control switching units in the first switching circuit in the case where the low-voltage measurement modules are all disconnected from the reference voltage source, and to obtain voltages $U_1, U_2, \ldots,$ and $U_n$ of the corresponding battery cells through measurement by the low-voltage measurement modules; the control module is further used for controlling the switching units in the first switching circuit, so as to control the switching units in the second switching circuit in the case where the low-voltage measurement modules are all disconnected from the battery cells, and to obtain voltages $V_1, V_2, \ldots,$ and $V_n$ output by the reference voltage source through measurement by the low-voltage measurement modules, respectively; and the control module is further used for calculating differences between $V_1, V_2, \ldots,$ and $V_n$ and the preset reference voltage separately to obtain errors $\sigma_{v1}, \sigma_{v2}, \ldots,$ and $\sigma_{vn}$ of the low-voltage measurement modules, and calibrating $U_1$, $U_2, \ldots,$ and $U_n$ according to $\sigma_{v1}, \sigma_{v2}, \ldots,$ and $\sigma_{vn}$ to obtain $U_1', U_2', \ldots,$ and $U_n'$, and using $U_{sum}$ obtained by summing up $U_1', U_2', \ldots,$ and $U_n'$ as a voltage output by the battery that is obtained through measurement.

In the above embodiments, a specific control approach of the control module is provided.

In some embodiments, the voltage measurement circuit further comprises a high-voltage measurement module, the two ends of the high-voltage measurement module being connected to the two ends of the battery, and the control module being further connected to the high-voltage measurement module, wherein the high-voltage measurement module is used for measuring the voltage output by the battery to obtain $V_{total}$; and the control module is specifically used for using $U_{sum}$ as the voltage output by the battery that is obtained through measurement when $|V_{total}-U_{sum}|$ is greater than a permissible error of the high-voltage measurement module.

In the above embodiments, in order to avoid the situation where the measured value keeps changing due to the too high precision of the low-voltage measurement module, the measurement circuit is also provided with a high-voltage measurement module with lower accuracy for directly measuring the voltage output by the battery, and only when the absolute value of the difference between the voltage $V_{total}$ measured by the high-voltage measurement module and $U_{sum}$ is greater than the permissible error of the high-voltage measurement module, the $U_{sum}$ measured by the low-voltage measurement module is used as the voltage output by the battery that is obtained through measurement.

In some embodiments, the control module is further specifically used for calibrating $U_1, U_2, \ldots,$ and $U_n$ according to the equation $U_n'=U_n-|\sigma_{vN}|$ when $|\sigma_{vN}|>\sigma_{allow}$ and $\sigma_{vN}\geq 0$; calibrating $U_1, U_2, \ldots,$ and $U_n$ according to the equation $U_n'=U_n+|\sigma_{vN}|$ when $|\sigma_{vN}|\geq \sigma_{allow}$ and $\sigma_{vN}<0$; and setting $U_n'=U_n$ when $|\sigma_{vN}|\leq \sigma_{allow}$, to obtain $U_1', U_2', \ldots,$ and $U_n'$, wherein $\sigma_{allow}$ is a set permissible error of the low-voltage measurement modules.

In the above embodiments, a specific implementation of the calibration of $U_1, U_2, \ldots, U_n$ is provided.

In some embodiments, $\sigma_{allow}$ is the smaller one of a first permissible error and a second permissible error, wherein the first permissible error is the maximum permissible error of the low-voltage measurement modules and the second permissible error is $|\sigma_{vtotal}|/N$, and $|\sigma_{vtotal}|$ is the maximum permissible error of the high-voltage measurement module.

In the above embodiments, the set permissible error (Sallow of the low-voltage measurement module is specifically the maximum permissible error of the low-voltage measurement module, and the maximum permissible error of the high-voltage measurement module is assigned with the smaller one of the second permissible errors on the low-voltage measurement modules, so that when the error satisfies (Sallow, the error requirements of both the low-voltage measurement module and the high-voltage measurement module can definitely be satisfied.

In some embodiments, the control module is further connected to the reference voltage source and the control module is further used for setting the preset reference voltage $V_{REF}=(V_1+V_2+\ldots+V_n)/n$.

In the above embodiments, setting the preset reference voltage to be the average value of $V_1, V_2, \ldots,$ and $V_n$ can make the preset reference voltage close to the interval in which the voltages of the battery cells are located, thus reducing the adjustment magnitude of each low-voltage measurement device and also reducing the time spent on adjustment.

In a second aspect, embodiments of the present application provide a voltage measurement method that is based on a control module in any of the voltage measurement circuits described above, the method comprising: controlling switching units in a first switching circuit and a second switching circuit to be on or off, and acquiring voltages of battery cells that are measured by low-voltage measurement modules.

In some embodiments, controlling switching units in a first switching circuit and a second switching circuit to be on or off, and acquiring voltages of battery cells that are measured by low-voltage measurement modules comprises: controlling switching units in the second switching circuit, so as to control switching units in the first switching circuit in the case where the low-voltage measurement modules are all disconnected from the reference voltage source, and to obtain voltages $U_1, U_2, \ldots,$ and $U_n$ of the corresponding battery cells through measurement by the low-voltage measurement modules; the method further comprises: controlling the switching units in the first switching circuit, so as to control the switching units in the second switching circuit in the case where the low-voltage measurement modules are all disconnected from the battery cells, and to obtain voltages $V_1, V_2, \ldots,$ and $V_n$ output by the reference voltage source through measurement by the low-voltage measurement modules, respectively; calculating differences between $V_1, V_2, \ldots,$ and $V_n$ and the preset reference voltage output by the reference voltage source separately to obtain errors $\sigma_{v1}, \sigma_{v2}, \ldots,$ and $\sigma_{vn}$ of the low-voltage measurement modules; and calibrating $U_1, U_2, \ldots,$ and $U_n$ according to $\sigma_{v1}, \sigma_{v2}, \ldots,$ and $\sigma_{vn}$ to obtain $U_1', U_2', \ldots,$ and $U_n'$; and using $U_{sum}$ obtained by summing up $U_1', U_2', \ldots,$ and $U_n'$ as a voltage output by the battery that is obtained through measurement.

In some embodiments, the voltage measurement circuit further comprises a high-voltage measurement module, the two ends of the high-voltage measurement module being connected to the two ends of the battery, and the control module being further connected to the high-voltage measurement module, wherein the high-voltage measurement module is used for measuring the voltage output by the battery to obtain $V_{total}$; and using $U_{sum}$ obtained by summing up $U_1', U_2', \ldots,$ and $U_n'$ as a voltage output by the battery that is obtained through measurement comprises: using $U_{sum}$ as the voltage output by the battery that is obtained through measurement when $|V_{total}-U_{sum}|$ is greater than a permissible error of the high-voltage measurement module.

In some embodiments, calibrating $U_1, U_2, \ldots,$ and $U_n$ according to $\sigma_{v1}, \sigma_{v2}, \ldots,$ and $\sigma_{vn}$ to obtain $U_1', U_2', \ldots,$ and $U_n'$ comprises: calibrating $U_1, U_2, \ldots,$ and $U_n$ according to the equation $U_n'=U_n-|\sigma_{vN}|$ when $|\sigma_{vN}|>\sigma_{allow}$ and $\sigma_{vN}\geq 0$; calibrating $U_1, U_2, \ldots,$ and $U_n$ according to the equation $U_n'=U_n+|\sigma_{vN}|$ when $|\sigma_{vN}|>\sigma_{allow}$ and $\sigma_{vN}<0$; and setting $U_n'=U_n$ when $|\sigma_{vN}|\leq \sigma_{allow}$, to obtain $U_1', U_2', \ldots,$ and $U_n'$, wherein $\sigma_{allow}$ is a set permissible error of the low-voltage measurement modules.

In some embodiments, $\sigma_{allow}$ is the smaller one of a first permissible error and a second permissible error, wherein the first permissible error is the maximum permissible error of the low-voltage measurement modules and the second permissible error is $|\sigma_{vtotal}|/N$, and $|\sigma_{vtotal}|$ is the maximum permissible error of the high-voltage measurement module.

In some embodiments, the control module is further connected to the reference voltage source and the control module is further used for setting the preset reference voltage $V_{REF}=(V_1+V_2+\ldots+V_n)/n$.

In a third aspect, embodiments of the present application provide a circuit board, comprising a voltage measurement circuit in the above mentioned implementations.

In a fourth aspect, embodiments of the present application provide a control module, comprising: at least one processor; and a memory communicatively connected to the at least one processor, wherein the memory stores instructions executable by the at least one processor, the instructions, when executed by the at least one processor, cause the at least one processor to perform the voltage measurement method described above.

The above description is only a summary of the technical solutions of the present application. In order to be able to understand the technical means of the present application more clearly, the technical means can be implemented according to the content of the specification. Furthermore, to make the above and other objectives, features and advantages of the present application more comprehensible, specific implementations of the present application are exemplified below.

DESCRIPTION OF DRAWINGS

In order to more clearly illustrate the technical solutions of embodiments of the present application, the following is a brief description of the accompanying drawings to be used in the embodiments of the present application. It is obvious that the accompanying drawings described below are only some embodiments of the present application, and other accompanying drawings can be obtained according to the accompanying drawings without any creative work for a person of ordinary skill in the art.

Figure 1:
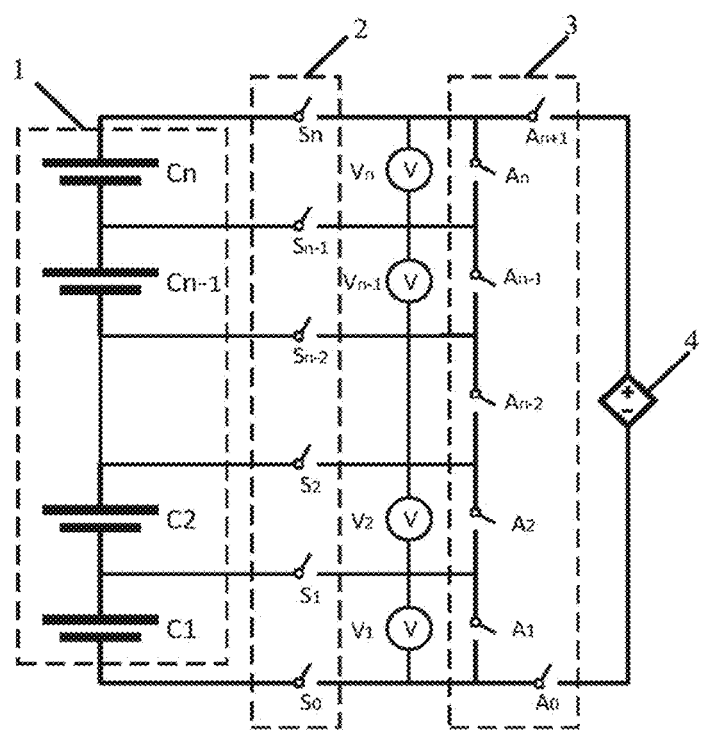
FIG. 1 is a schematic circuit diagram I of a voltage measurement circuit disclosed in an embodiment of the present application.

In the accompanying drawings, the accompanying drawings are not drawn to actual scale.

Description of reference numerals: battery—1, first switching circuit—2, second switching circuit—3, reference voltage source—4, high-voltage measurement module—5, battery cells—low-voltage measurement modules—$V_1$-$V_n$, first switching units—$S_0$-$S_n$, second switching units—$A_0$-$A_{n+1}$/$A_0$-$A_{2n-1}$.

DETAILED DESCRIPTION

Embodiments of the present application will be described in further detail hereinafter in conjunction with the accompanying drawings and embodiments. The following detailed description of the embodiments and the drawings are used to illustrate the principles of the present application by way of example, but should not be used to limit the scope of the present application, that is, the present application is not limited to the described embodiments.

In the description of the present application, it should be noted that, unless otherwise stated, "plurality of" means two or more; the orientation or positional relationships indicated by the terms "upper", "lower", "left", "right", "inner" and "outer" are only for facilitating the description of the present application and simplifying the description, rather than indicating or implying that the apparatus or element referred to must have a particular orientation or be constructed and operated in a particular orientation, and therefore will not be interpreted as limiting the present application. In addition, the terms "first", "second" and "third" are only used for descriptive purposes, and cannot be construed as indicating or implying relative importance. "Vertical" does not mean being vertical in the strict sense, but within the permissible range of error. "Parallel" does not mean being parallel in the strict sense, but within the permissible range of error.

Orientation words appearing in the following description are all directions shown in the drawings, and do not limit the specific structure of the present application. In the description of the present application, it should also be noted that, unless otherwise expressly specified and defined, the terms "install", "connected" and "connect" should be understood in a broad sense, for example, they may be fixedly connected, detachably connected or integrally connected; and they may be directly connected or indirectly connected through an intermediate medium. For those of ordinary skill in the art, the specific meanings of the above terms in the present application may be understood according to specific circumstances.

In the description of the embodiments of the present application, the term "and/or" is only an association relationship for describing associated objects, indicating that there may be three relationships, for example A and/or B may represent three situations: A exists alone, both A and B exist, and B exists alone. In addition, the character "/" herein generally means that the associated objects before and after it are in an "or" relationship.

In the field of voltage measurement, technicians usually use instruments such as multimeters and voltage measurement instruments to measure voltages, but these conventional measurement instruments cannot balance the range and the precision, and if a large range of voltage is to be measured, it is only possible to be achieved by reducing the measurement precision; and if the measurement precision is to be improved, it is only possible to be achieved by measuring a small range of voltage. At present, the problem of performing high-precision measurements on a large-range of voltage is in urgent need of solution.

With the rapid development of new energy industry, the use of battery systems as energy storage and release devices is becoming more and more common, and battery voltage is one of the most basic monitoring parameters of battery systems. Battery voltage can be used for high-voltage fault diagnosis, relay diagnosis, charge and discharge management, and battery safety warning, and other aspects. These functions can not be achieved without accurate and reliable voltage measurements, and at present, changes in the precision of voltage measurements lack the necessary continuous monitoring and correction, and the reliability is not high.

For example, a battery used in a new energy vehicle is usually made of multiple battery cells connected in series and parallel, and the voltage of the battery is usually high, so a large-range measuring instrument is needed to measure them, but the precision of the large-range measuring instrument is low, so it is difficult to meet the requirements for the measurement precision of the battery voltage.

Based on the above problems, the present application proposes the following technical idea: for a battery formed by a plurality of battery cells connected in series, specifically, the voltages of the battery cells are measured separately by a plurality of low-voltage measurement modules with small range but high precision, and the measured voltages of the battery cells are summed up as the measured voltage of the battery, so as to balance the large range and high accuracy of the measured voltage. In some embodiments, a reference voltage source with higher precision compared to the low-voltage measurement modules can also be used to calibrate each low-voltage measurement module to further ensure the measurement precision of the voltage measurement circuit. In some embodiments, in order to avoid the situation where the measured values keep changing due to the too high precision of the low-voltage measurement modules, a high-voltage measurement module with a large range but smaller precision can also be provided to directly measure the voltage of the battery, and the measured voltage of the battery that is calculated according to the low-voltage measurement modules can be used as a standard to calibrate the high-voltage measurement module when the measurement error of the high-voltage measurement module is too large, while when the measurement error is within a permissible range, the measurement result of the high-voltage measurement module is used directly.

Embodiments of the present application provides a voltage measurement circuit for measuring a voltage output by a battery. Please refer to FIG. 1, the battery 1 comprises n battery cells $C_1$-$C_n$ connected in series, wherein n is an integer greater than 1; and the voltage measurement circuit comprises: n low-voltage measurement modules $V_1$-$V_n$ provided in one-to-one correspondence with then battery cells $C_1$-$C_n$, a first switching circuit 2, a second switching circuit 3, a reference voltage source 4, and a control module (the control module is not shown in the figure), wherein the reference voltage source 4 is used for outputting a preset reference voltage; the two ends of each of the low-voltage measurement modules are connected to the two ends of the corresponding battery cell via the first switching circuit 2, the two ends of each of the low-voltage measurement modules are further connected to the two ends of the reference voltage source 4 via the second switching circuit 3, the control module is connected to switching units in the first switching circuit 2 and the second switching circuit 3, and the control module is further connected to each of the low-voltage measurement modules (the control module and the connections between the control module and the low-voltage measurement modules are not shown in the figure).

The control module is used for controlling the switching units in the first switching circuit 2 and the second switching circuit 3 to be on or off, and acquiring voltages of battery cells that are measured by low-voltage measurement modules.

The following is a specific description of the implementation details of the voltage measurement circuit of this implementation, and the following content is provided as implementation details for ease of understanding only and is not necessary to implement this solution.

The low-voltage measurement module may be a small-range voltage sensor, for example, a small-range voltmeter.

The reference voltage source may be a programmable high-precision reference voltage source generation module, which can generate high-precision reference voltages of different voltage values according to actual needs, and the voltage values can be adjusted by programming.

The first switching circuit and the second switching circuit are circuits separately formed by a plurality of switching units connected in series and/or in parallel, wherein the switching units are, for example, knife switches or relays.

Specifically, the low-voltage measurement modules are connected to the corresponding battery cells via the first switching circuit, the low-voltage measurement modules are further connected to the reference voltage source via the second switching circuit, and the control module can control whether the low-voltage measurement modules measure the voltages of the battery cells or the voltage of the reference voltage source by controlling the on and off of the switching units in the first switching circuit and the second switching circuit. When the control module only controls connecting the low-voltage measurement modules and the battery cells, the low-voltage measurement modules measure the voltages of the battery cells, and when the control module only controls connecting the low-voltage measurement modules and the reference voltage source, the low-voltage measurement modules measure the voltage of the reference voltage source, at which time the output voltage of the reference voltage source and the voltages measured by the low-voltage measurement modules can be used to calibrate the low-voltage measurement modules.

In this embodiment, since the measurement range of the low-voltage measurement module is small but the measurement precision is high, the voltages across the n battery cells in the battery can be measured by the n low-voltage measurement modules, respectively, and the measured voltages can be summed up as the voltage output by the battery that is obtained through measurement, which not only expands the measurement range of the voltage measurement circuit, but also ensures that the measurement precision of the summed voltage is close to that of the low-voltage measurement module, so that the large-range measurement and the measurement precision can be balanced. In addition, embodiments of the present application can also use a reference voltage source to calibrate each of the low-voltage measurement modules, which can further improve the accuracy of voltage measurement by the measurement device.

In some embodiments, refer to FIG. 1, the first switching circuit 2 comprises n+1 first switching units $S_0$-$S_n$.

N−1 connection nodes formed by series connection of the n low-voltage measurement modules $V_1$-$V_n$ and the two ends of a branch circuit formed by series connection of the n low-voltage measurement modules $V_1$-$V_n$ are used as first connectable nodes, and n−1 connection nodes formed by series connection of then battery cells $C_1$-$C_n$ and the two ends of a branch circuit formed by series connection of the n battery cells $C_1$-$C_n$ are used as second connectable nodes, the first connectable nodes being separately connected to corresponding ones of the second connectable nodes via the first switching units.

On a branch circuit formed by the sequential series connection of the n low-voltage measurement modules, n−1 connection nodes are formed. A connection node here can be considered as a node located on the connection line between any two low-voltage measurement modules connected on the branch circuit. The first connectable nodes comprise these n−1 connection nodes, as well as two endpoints (as two nodes) of the branch circuit formed by series connection of the n low-voltage measurement modules, and it can be seen that there are a total of n+1 first connectable nodes.

On a branch circuit formed by the sequential series connection of the n battery cells, n−1 connection nodes are formed. A connection node here can be considered as a node located on the connection line between any two battery cells connected on the branch circuit. The second connectable nodes comprise these n−1 connectable nodes, as well as two endpoints (as two nodes) of the branch circuit formed by series connection of the n battery cells, and it is seen that there are a total of n+1 second connectable nodes.

In some embodiments, the two ends of a low-voltage measurement module can also be connected to the two ends of the corresponding battery cell via two first switching units. For example, the two ends of $V_1$ are connected to the two ends of $C_1$ via the first switching units $S_0$ and $S_1$, the two ends of $V_2$ are connected to the two ends of $C_2$ via the first switching units $S_1$ and $S_2$, and so on, and the two ends of $V_n$ are connected to the two ends of $C_n$ via the first switching units $S_n-1$ and $S_n$.

The control module can connect the low-voltage measurement modules $V_1$-$V_n$ and the corresponding battery cells $C_1$-$C_n$ by controlling the first switching units to be on, so that the low-voltage measurement modules $V_1$-$V_n$ can measure the voltages of the corresponding battery cells $C_1$-$C_n$.

In the above embodiments, a specific circuit structure of the first switching circuit is provided.

In some embodiments, refer to FIG. 1, the second switching circuit 3 comprises n+2 second switching units $A_0$-$A_{n+1}$.

N−1 connection nodes formed by series connection of n second switching units and the two ends of a branch circuit formed by series connection of n second switching units are used as third connectable nodes, the first connectable nodes being separately connected to corresponding ones of the third connectable nodes via the second switching units, and the two ends of a branch circuit formed by series connection of the second switching units are further connected to the two ends of the reference voltage source 4 via the second switching units.

On a branch circuit formed by the sequential series connection of the n second switching units, n−1 connection nodes are formed. A connection node here can be considered as a node located on the connection line between any two second switching units connected on the branch circuit. The third connectable nodes comprise these n−1 connectable nodes, as well as two endpoints (as two nodes) of the branch circuit formed by series connection of the n second switching units, and it can be seen that there are a total of n+1 third connectable nodes.

For example, the control module can specifically connect the series loop of the low-voltage measurement module $V_1$ and the reference voltage source 4 by controlling all the second switching units except $A_1$ to be on and only $A_1$ to be off, so that the output voltage of the reference voltage source 4 is measured by the low-voltage measurement module $V_1$, and then the low-voltage measurement module $V_1$ is calibrated by comparing the measured voltage of the low-voltage measurement module $V_1$ with a preset output voltage of the reference voltage source 4. Similarly, the control module can connect the series loop of the low-voltage measurement module $V_2$ and the reference voltage source 4 by controlling all the second switching units except $A_2$ to be on and only $A_2$ to be off, thus calibrating the low-voltage measurement module $V_2$. By analogy, the low-voltage measurement modules $V_1$-$V_n$ can all be calibrated to improve the accuracy of the measurement of the battery voltage by the voltage measurement circuit.

In the above embodiments, a specific circuit structure of the second switching circuit is provided.

Figure 2:
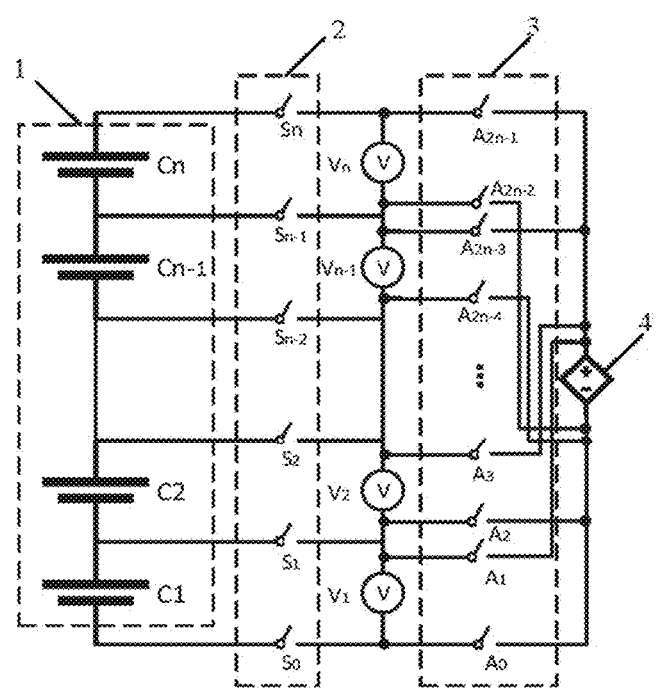
FIG. 2 is a schematic circuit diagram II of a voltage measurement circuit disclosed in an embodiment of the present application.

In some embodiments, refer to FIG. 2, the second switching circuit comprises 2n second switching units $A_0$-$A_{2n-1}$; and the two ends of each of the n low-voltage measurement modules $V_1$-$V_n$ are connected at the two ends of the reference voltage source 4 via the second switching units.

The control module can specifically connect the series loop of the low-voltage measurement modules $V_1$-$V_n$ and the reference voltage source 4 by turning the second switching units on, so that the output voltage of the reference voltage source 4 can be measured by the low-voltage measurement modules $V_1$-$V_n$, and then the low-voltage measurement modules $V_1$-$V_n$ can be calibrated by comparing the measured voltages of the low-voltage measurement modules $V_1$-$V_n$ with the output voltage of the reference voltage source 4, so as to improve the accuracy of measurement of the battery voltage by the voltage measurement circuit.

For example, the control module can connect the series loop of the low-voltage measurement module $V_1$ and the reference voltage source 4 by turning on $A_0$ and $A_1$; and the control module can also connect the series loop of the low-voltage measurement module $V_2$ and the reference voltage source 4 by turning on $A_2$ and $A_3$. By analogy, the control module can simultaneously connect the series loops of the low-voltage measurement modules $V_1$-$V_n$ and the reference voltage source 4 by simultaneously turning on the second switching unit $A_0$-$A_{2n-1}$, and thus the low-voltage measurement modules $V_1$-$V_n$ can simultaneously measure the voltage across of the reference voltage source 4, that is, the low-voltage measurement modules can measure the voltage across the reference voltage source 4 in parallel.

The above embodiment provides another circuit structure of the second switching circuit that eliminates the need to turn on all the second switching units except $A_1$-$A_n$ in sequence to connect the series loop of the low-voltage measurement modules $V_1$-$V_n$ and the reference voltage source when turning on $A_0$ and $A_{n+1}$ as in the corresponding embodiment of FIG. 1. In this embodiment, the low-voltage measurement modules $V_1$-$V_n$ can measure the voltage across the reference voltage source simultaneously, thus reducing the time to acquire the error value corresponding to each low-voltage measurement module.

In some embodiments, a specific control approach of the control module is provided. The control module is used for controlling the switching units in the second switching circuit 3, so as to control the switching units in the first switching circuit 2 in the case where the low-voltage measurement modules $V_1$-$V_n$ are all disconnected from the reference voltage source 4, and to obtain voltages $U_1$, $U_2$, . . . , and $U_n$ of the corresponding battery cells $C_1$-$C_n$ through measurement by the low-voltage measurement modules $V_1$-$V_n$; the control module is further used for controlling the switching units in the first switching circuit 2, so as to control the switching units in the second switching circuit 3 in the case where the low-voltage measurement modules $V_1$-$V_n$ are all disconnected from the battery cells $C_1$-$C_n$, and to obtain voltages $V_1$, $V_2$, . . . , and $V_n$ output by the reference voltage source 4 through measurement by the low-voltage measurement modules $V_1$-$V_n$, respectively; and the control module is further used for calculating differences between $V_1$, $V_2$, . . . , and $V_n$ and the preset reference voltage separately to obtain errors $\sigma_{v1}$, $\sigma_{v2}$, . . . , and $\sigma_{vn}$ of the low-voltage measurement modules $V_1$-$V_n$, and calibrating $U_1$, $U_2$, . . . , and $U_n$ according to $\sigma_{v1}$, $\sigma_{v2}$, . . . , and $\sigma_{vn}$ to obtain $U_1'$, $U_2'$, . . . , and $U_n'$, and using $U_{sum}$ obtained by summing up $U_1'$, $U_2'$, . . . , and $U_n'$ as a voltage output by the battery that is obtained through measurement 1.

The circuit of FIG. 1 is illustrated as an example. The control module records the measured values $U_1$, $U_2$, . . . , and $U_n$ of the low-voltage measurement modules $V_1$-$V_n$ when $A_0$-$A_{n+1}$ are turned off and $S_0$-$S_n$ are turned on; the control module also turns on all the second switching units except $A_1$-$A_n$ in sequence when $S_0$-$S_n$ are turned off and $A_0$ and $A_{n+1}$ are turned on so as to record the measured values $V_1$, $V_2, \ldots,$ and $V_n$ across the reference voltage source 4 measured by the low-voltage measurement modules $V_1$-$V_n$, respectively, and then calculates differences between $V_1$, $V_2, \ldots,$ and $V_n$ and the preset reference voltage separately to obtain errors $\sigma_{v1}, \sigma_{v2},$ and $\sigma_{vn}$ of the low-voltage measurement modules $V_1$-$V_n$, and calibrates $U_1, U_2, \ldots,$ and $U_n$ according to $\sigma_{v1}, \sigma_{v2}, \ldots,$ and $\sigma_{vn}$ to obtain $U_1'$, $U_2', \ldots,$ and $U_n'$, and then uses the $U_{sum}$ obtained by summing up $U_1', U_2', \ldots,$ and $U_n'$ as the voltage output by the battery that is obtained through measurement 1.

The calibration of $U_1$ is illustrated as an example below. When the control module turns on $S_0$ and $S_1$, the series loop of the low-voltage measurement module $V_1$ and the battery cell $C_1$ is connected, and the voltage $U_1$=5 V of the battery cell $C_1$ measured by the low-voltage measurement module $V_1$ is recorded; when the control module turns on all the second switching units except $A_1$, the series loop of the low-voltage measurement module $V_1$ and the reference voltage source 4 is connected, and the voltage $V_1$=3V of the reference voltage source 4 measured by the low-voltage measurement module $V_1$ is recorded, and if the preset reference voltage of the reference voltage source 4 is 2.8V, the error of the low-voltage measurement module $V_1$ is $\sigma_{v1}$=3−2.8=0.2V, which means that the measured value of the low-voltage measurement module $V_1$ can be considered to be 0.2V larger than the actual value, and thus $\sigma_{v1}$ can be used to calibrate the $U_1$ measured by the low-voltage measurement module $V_1$, for example, $U_1'$=$U_1$−$\sigma_{v1}$=5−0.2=4.8V.

In the above embodiment, a specific control approach of the control module is provided, and the measurement errors $\sigma_{v1}, \sigma_{v2}, \ldots,$ and $\sigma_{vn}$ of the low-voltage measurement modules can be obtained relatively accurately, and the precision decline of the low-voltage measurement modules can be compensated by means of calibration to ensure the accuracy of measurement throughout the life cycle of the low-voltage measurement modules.

Figure 3:
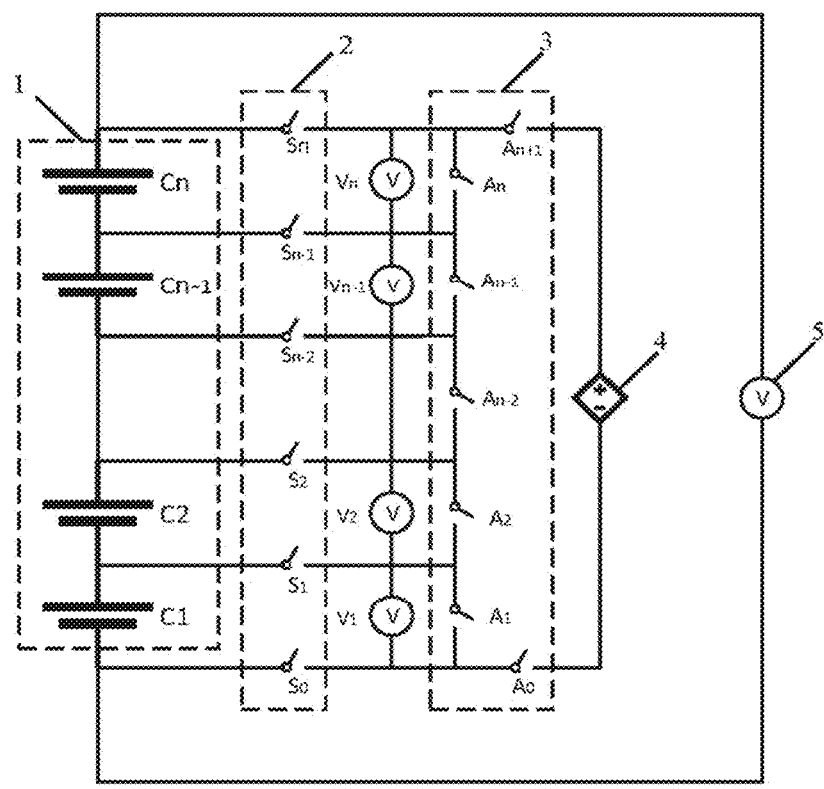
FIG. 3 is a schematic circuit diagram III of a voltage measurement circuit disclosed in an embodiment of the present application.

In some embodiments, refer to FIG. 3, the voltage measurement circuit further comprises a high-voltage measurement module 5, the two ends of the high-voltage measurement module 5 being connected to the two ends of the battery 1, and the control module being further connected to the high-voltage measurement module 5.

In some embodiments, one end of the high-voltage measurement module 5 may be connected to one end of the battery 1 via at least one switching unit, and the other end of the battery 1 is then connected to the other end of the high-voltage measurement module 5, or the two ends of the high-voltage measurement module 5 may each be connected to the two ends of the battery 1 via at least one switching unit. The control module is connected to the switching units and is used to control the switching units to be on or off. When the control module controls the switching units to be on, the measurement loop of the high-voltage measurement module 5 and the battery 1 is connected so as to measure the voltage across the battery 1 by the high-voltage measurement module 5.

In some embodiments, one of the two ends of the high-voltage measurement module 5 may be connected to one of the two ends of the battery 1 via a switching unit, and the control module is also connected to the two switching units for controlling the switching units to be on or off. When the control module controls the two switching units to be on simultaneously, the measurement loop of the high-voltage measurement module 5 and the battery 1 is connected so as to measure the voltage across the battery 1 by the high-voltage measurement module 5.

The high-voltage measurement module 5 is used for measuring the voltage output by the battery 1 to obtain $V_{total}$; and the control module is specifically used for using $U_{sum}$ as the voltage output by the battery that is obtained through measurement 1 when $|V_{total}-U_{sum}|$ is greater than a permissible error of the high-voltage measurement module 5.

The high-voltage measurement module 5 may be a large-range voltage sensor, for example, a large-range voltmeter.

Since the measurement range of the low-voltage measurement module is small and the measurement precision is high, for example, the measurement precision of the low-voltage measurement module is 0.01V, so when the change of the measured value of the low-voltage measurement module is greater than 0.01V, the measured value recorded by the low-voltage measurement module will be changed, which may cause the measured value of the voltage of the battery 1 output by the voltage measurement circuit to keep changing up and down, thus making the output measured value not stable enough.

In this embodiment, by setting the high-voltage measurement module 5 having lower measurement precision, the voltage $V_{total}$ across the battery 1 is measured directly by the high-voltage measurement module 5, and then the $U_{sum}$ obtained through measurement by the low-voltage measurement module and calculation is acquired, and then the voltage measured by the high-voltage measurement module 5 is compared with $U_{sum}$. If the absolute value of the difference between the two is too large, specifically, greater than the permissible error of the high-voltage measurement module 5, it is considered that, at this time, the measurement precision of the high-voltage measurement module 5 is difficult to reach the measurement precision of measuring the voltage of the battery 1, so it is necessary to calibrate the measured value of the high-voltage measurement module 5 according to $U_{sum}$, specifically, using $U_{sum}$ as the measured value of the high-voltage measurement module 5.

In the above embodiments, in order to avoid the situation where the measured value of the battery measured by the voltage measurement circuit keeps changing due to the too high precision of the low-voltage measurement module, the measurement circuit is also provided with a high-voltage measurement module with lower accuracy for directly measuring the voltage output by the battery, and only when the absolute value of the difference between the voltage $V_{total}$ measured by the high-voltage measurement module and $U_{sum}$ is greater than the permissible error of the high-voltage measurement module, the $U_{sum}$ measured by the low-voltage measurement module is used as the voltage output by the battery that is obtained through measurement. The above embodiments can obtain the test error $|V_{total}-U_{sum}|$ of the high-voltage measurement module relatively accurately, and obtain, through calibration, a high-precision high-voltage measured value that is beneficial for more accurate high-voltage fault diagnosis, relay diagnosis, charging and discharging management, and battery safety warning, among others.

In some embodiments, a specific implementation of the calibration of $U_1, U_2, \ldots, U_n$ is provided. The control module is further specifically used for calibrating $U_1$, $U_2, \ldots,$ and $U_n$ according to the equation $U_n'=U_n-|\sigma_{vN}|$ when $|\sigma_{vN}|>\sigma_{allow}$ and $\sigma_{vN} \geq 0$, calibrating $U_1, U_2, \ldots,$ and $U_n$ according to the equation $U_n'=U_n+|\sigma_{vN}|$ when $|\sigma_{vN}|>\sigma_{allow}$ and $\sigma_{vN}<0$; and setting $U_n'=U_n$ when $|\sigma_{vN}| \leq \sigma_{allow}$ to obtain $U_1'$, $U_2'$, ..., and $U_n'$, wherein $\sigma_{allow}$ is a set permissible error of the low-voltage measurement modules $V_1$-$V_n$.

The control module can calibrate $U_1$, $U_2$, ..., and $U_n$ when the measurement error of the low-voltage measurement module is too large, specifically when $|\sigma_{vN}| > \sigma_{allow}$. There are two cases here, one of which is when $\sigma_{vN} \geq 0$, in which case it is considered that the measured value of the low-voltage measurement module is too large compared to the actual value, and at this time $U_1$, $U_2$, ..., and $U_n$ are calibrated by subtracting the difference between the measured value and the actual value, i.e., by $U_n' = U_n - |\sigma_{vN}|$; and the other is when $\sigma_{vN} < 0$, in which case it is considered that the measured value of the low-voltage measurement module is too small compared to the actual value, and at this time $U_1$, $U_2$, ..., and $U_n$ are calibrated by adding the difference between the measured value and the actual value, i.e., by $U_n' = U_n + |\sigma_{vN}|$ so as to obtain $U_1'$, $U_2'$, ..., and $U_n'$.

When the measurement error of the low-voltage measurement module is within the permissible range, specifically when $|\sigma_{vN}| \leq \sigma_{allow}$, the control module directly sets $U_n' = U_n$ to obtain $U_1'$, $U_2'$, ..., and $U_n'$, which is equivalent to not calibrating $U_1$, $U_2$, ..., and $U_n$.

The calibration of $U_1$ is illustrated as an example. If $\sigma_{v1} = 0.2V$ and $\sigma_{allow} = 0.1V$, at this time $\sigma_{v1} > \sigma_{allow}$, then it is necessary to calibrate $U_1$, and since $\sigma_{v1} = 0.2V > 0$, $U_1' = U_1 - \sigma_{v1} = U_1 - 0.2V$.

In some embodiments, hallow is the smaller one of a first permissible error and a second permissible error, wherein the first permissible error is the maximum permissible error of the low-voltage measurement modules and the second permissible error is $|\sigma_{vtotal}|/N$, and $|\sigma_{vtotal}|$ is the maximum permissible error of the high-voltage measurement module.

In the above embodiments, the set permissible error (Sallow of the low-voltage measurement module is specifically the maximum permissible error of the low-voltage measurement module, and the maximum permissible error of the high-voltage measurement module is assigned with the smaller one of the second permissible errors on the low-voltage measurement modules, so that when the error satisfies (Sallow, the error requirements of both the low-voltage measurement module and the high-voltage measurement module can definitely be satisfied.

In some embodiments, the control module may further be connected to the reference voltage source 4 and the control module may further set the preset reference voltage $V_{REF} = (V_1 + V_2 + \ldots + V_n)/n$.

In some other embodiments, the technicians may also set the preset reference voltage $V_{REF}$ according to the practical needs.

In the above embodiments, setting the preset reference voltage to be the average value of $V_1$, $V_2$, ..., and $V_n$ can make the preset reference voltage close to the interval in which the voltages of the battery cells are located, thus reducing the adjustment magnitude of each low-voltage measurement device and also reducing the time spent on adjustment.

Embodiments of the present application provide a voltage measurement method that is based on a control module in a voltage measurement circuit of any of the above embodiments, and reference can be made to the corresponding embodiments of the voltage measurement circuit described above for the components included in the voltage measurement circuit and the connection relationship between the modules, etc.

The voltage measurement method comprises: controlling switching units in a first switching circuit and a second switching circuit to be on or off, and acquiring voltages of battery cells that are measured by low-voltage measurement modules.

In some embodiments, controlling switching units in a first switching circuit and a second switching circuit to be on or off, and acquiring voltages of battery cells that are measured by low-voltage measurement modules comprises: controlling switching units in the second switching circuit, so as to control switching units in the first switching circuit in the case where the low-voltage measurement modules are all disconnected from the reference voltage source, and to obtain voltages $U_1$, $U_2$, ..., and $U_n$ of the corresponding battery cells through measurement by the low-voltage measurement modules; the method further comprises: controlling switching units in the first switching circuit, so as to control switching units in the second switching circuit in the case where the low-voltage measurement modules are all disconnected from the battery cells, and to obtain voltages $V_1$, $V_2$, ..., and $V_n$ output by the reference voltage source through measurement by the low-voltage measurement modules, respectively; calculating differences between $V_1$, $V_2$, ..., and $V_n$ and the preset reference voltage output by the reference voltage source separately to obtain errors $\sigma_{v1}$, $\sigma_{v2}$, ..., and $\sigma_{vn}$ of the low-voltage measurement modules; and calibrating $U_1$, $U_2$, ..., and $U_n$ according to $\sigma_{v1}$, $\sigma_{v2}$, ..., and $\sigma_{vn}$ to obtain $U_1'$, $U_2'$, ..., and $U_n'$; and using $U_{sum}$ obtained by summing up $U_1'$, $U_2'$, ..., and $U_n'$ as a voltage output by the battery that is obtained through measurement.

In some embodiments, the voltage measurement circuit further comprises a high-voltage measurement module, the two ends of the high-voltage measurement module being connected to the two ends of the battery, and the control module being further connected to the high-voltage measurement module, wherein the high-voltage measurement module is used for measuring the voltage output by the battery to obtain $V_{total}$; and using $U_{sum}$ obtained by summing up $U_1'$, $U_2'$, ..., and $U_n'$ as a voltage output by the battery that is obtained through measurement comprises: using $U_{sum}$ as the voltage output by the battery that is obtained through measurement when $|V_{total} - U_{sum}|$ is greater than a permissible error of the high-voltage measurement module.

In some embodiments, $U_1$, $U_2$, ..., and $U_n$ are calibrated according to the equation $U_n' = U_n - |\sigma_{vN}|$ when $|\sigma_{vN}| > \sigma_{allow}$ and $\sigma_{vN} \geq 0$; $U_1$, $U_2$, ..., and $U_n$ are calibrated according to the equation $U_n' = U_n + |\sigma_{vN}|$ when $|\sigma_{vN}| > \sigma_{allow}$ and $|\sigma_{vN}| < 0$; and when $|\sigma_{vn}| \leq \sigma_{allow}$, $U_n' = U_n$, so that $U_1'$, $U_2'$, ..., and $U_n'$ are obtained, wherein $\sigma_{allow}$ is a set permissible error of the low-voltage measurement modules.

In some embodiments, $\sigma_{allow}$ is the smaller one of a first permissible error and a second permissible error, wherein the first permissible error is the maximum permissible error of the low-voltage measurement modules and the second permissible error is $|\sigma_{vtotal}|/N$, and $|\sigma_{vtotal}|$ is the maximum permissible error of the high-voltage measurement module.

In some embodiments, the control module is further connected to the reference voltage source and the control module is further used for setting the preset reference voltage $V_{REF} = (V_1 + V_2 + \ldots + V_n)/n$.

Figure 4:
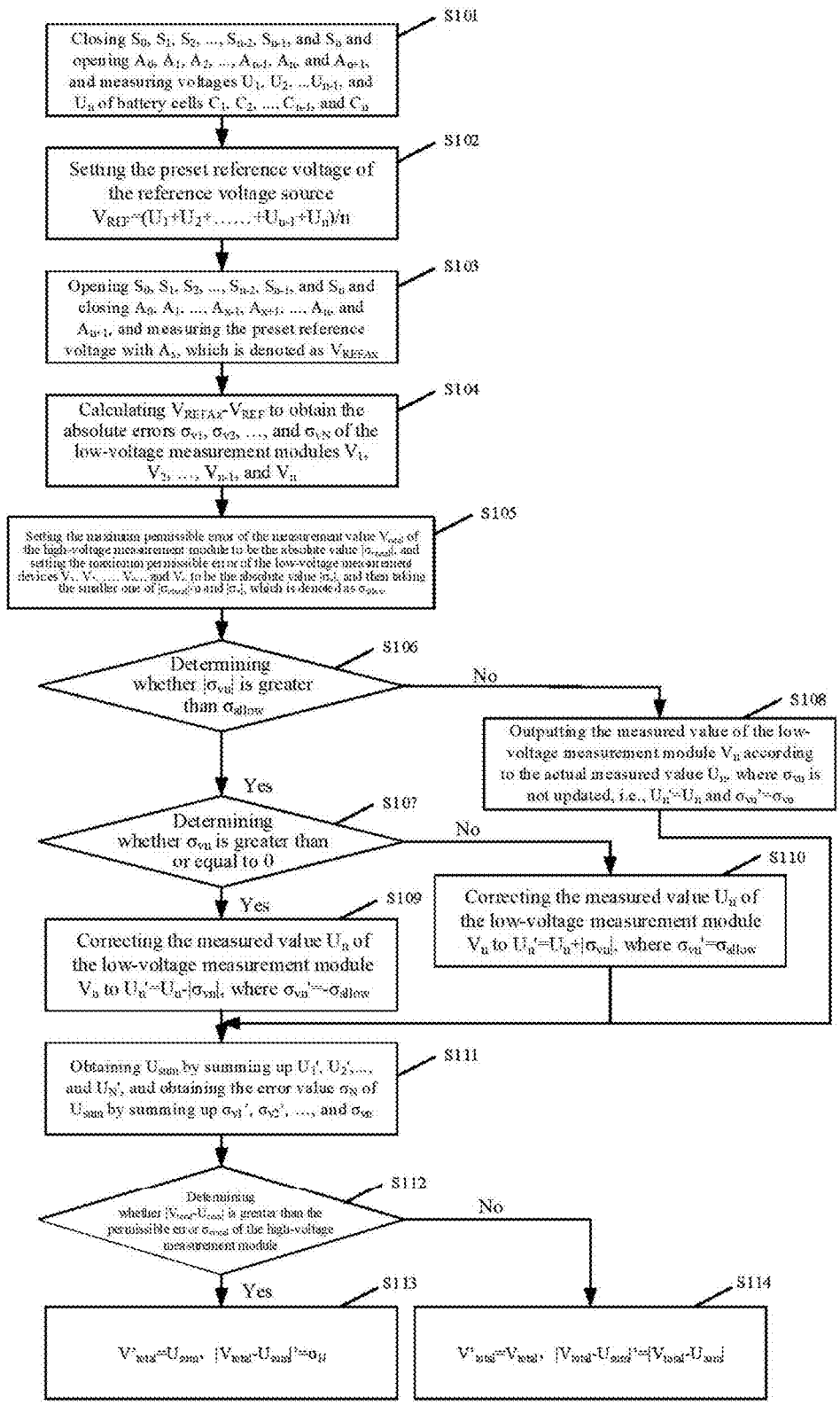
FIG. 4 is a schematic flow diagram of a voltage measurement method disclosed in an embodiment of the present application.

In some embodiments, based on the schematic circuit diagram of FIG. 3, reference can be made to the schematic flow diagram of the voltage measurement method of FIG. 4.

Step 101: closing $S_0$, $S_1$, $S_2$, ..., $S_{n-2}$, $S_{n-1}$, and $S_n$ and opening $A_0$, $A_1$, $A_2$, ..., $A_{n-1}$, $A_n$, and $A_{n+1}$, and measuring voltages $U_1$, $U_2$, ..., $U_{n-1}$, and $U_n$ of battery cells $C_1$, $C_2$, ..., $C_{n-1}$, and $C_n$.

Step 102: setting the preset reference voltage $V_{REF}$ of the reference voltage source as the average value of $U_1$, $U_2, \ldots, U_{n-1}$, and $U_n$, i.e., $V_{REF}=(U_1+U_2+\ldots+U_{n-1}+U_n)/n$.

Step 103: opening $S_0, S_1, S_2, \ldots, S_{n-2}, S_{n-1}$, and $S_n$ and closing $A_0, A_1, \ldots, A_{x-1}, A_{x+1}, \ldots, A_n$, and $A_{n+1}$, and measuring the preset reference voltage with $A_x$, which is denoted as $V_{REFAx}$.

Among them, closing $A_0, A_1, \ldots A_{x-1}, A_{x+1}, \ldots, A_n$ and $A_{n+1}$ means closing all A-numbered switches except $A_x$; and x ranges from 1 to n, and accordingly, $V_{REFA1}$, $V_{REFA2}$, $V_{REFAn-1}$, and $V_{REFAn}$ can be measured.

Step 104: calculating $V_{REFAx}$-$V_{REF}$ to obtain the absolute errors $\sigma_{v1}, \sigma_{v2}, \ldots$, and $\sigma_{vn}$ of the low-voltage measurement modules $V_1, V_2, \ldots, V_{n-1}$, and $V_n$.

Among them, $\sigma_{v1}, \sigma_{v2}, \ldots$, and $\sigma_{vn}$ may be positive, may be negative, or may be 0.

Step 105: setting the maximum permissible error of the measurement value $V_{total}$ of the high-voltage measurement module to be the absolute value $|\sigma_{vtotal}|$, and setting the maximum permissible error of the low-voltage measurement devices $V_1, V_2, \ldots, V_{n-1}$, and $V_n$ to be the absolute value $|\sigma_v|$, and then taking the smaller one of $|\sigma_{vtotal}|/n$ and $|\sigma_v|$, which is denoted as $\sigma_{allow}$.

Step 106: determining whether $|\sigma_{vn}|$ is greater than if yes, proceeding to step 107; and if not, proceeding to step 108.

Step 107: determining whether $\sigma_{vn}$ is greater than or equal to 0; if yes, proceeding to step 109; and if not, proceeding to step 110.

Step 108: outputting the measured value of the low-voltage measurement module $V_n$ according to the actual measured value $U_n$, where $\sigma_{vn}$ is not updated, i.e., $U_n'=U_n$ and $\sigma_{vn}'=\sigma_{vn}$.

Step 109: correcting the measured value $U_n$ of the low-voltage measurement module $V_n$ to $U_n'=U_n-|\sigma_{vn}|$, where $\sigma_{vn}'=\sigma_{allow}$.

Step 110: correcting the measured value $U_n$ of the low-voltage measurement module $V_n$ to $U_n'=U_n+|\sigma_{vn}|$, where $\sigma_{vn}'=\sigma_{allow}$.

Step 111: obtaining $U_{sum}$ by summing up $U_1', U_2', \ldots$, and $U_n'$, and obtaining the error value $\sigma_n$ of $U_{sum}$ by summing up $\sigma_{v1}', \sigma_{v2}', \ldots$, and $\sigma_{vn}'$.

Step 112: determining whether $|V_{total}-U_{sum}|$ is greater than the permissible error $\sigma_{vtotal}$ of the high-voltage measurement module, if yes, proceeding to step 113; and if not, proceeding to step 114.

Step 113: correcting $V_{total}$ to $U_{sum}$, wherein $|V_{total}-U_{sum}|$ is updated to $\sigma_n$ and output, i.e., $V'_{total}=U_{sum}$, and $|V_{total}-U_{sum}|=\sigma_n$.

Step 114: performing outputting in accordance with the actual measured value $V_{total}$ of the high-voltage measurement module, wherein $|V_{total}-U_{sum}|$ remains unchanged, i.e., $V'_{total}=V_{total}$, and $|V_{total}-U_{sum}|=|V_{total}-U_{sum}|$.

Embodiments of the present application provide a circuit board, comprising a voltage measurement circuit in the above mentioned implementations.

Figure 5:
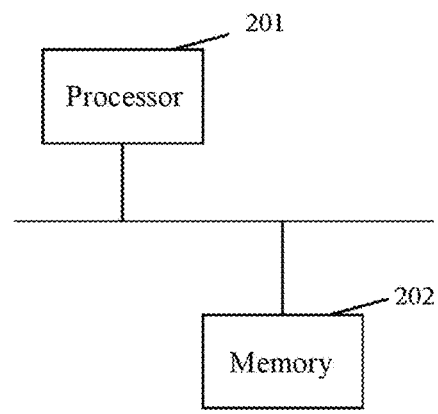
FIG. 5 is a schematic block diagram of a control module disclosed in an embodiment of the present application.

Embodiments of the present application provide a control module which, with reference to FIG. 5, comprises: at least one processor 201; and a memory 202 communicatively connected to the at least one processor 201, wherein the memory 202 stores instructions executable by the at least one processor 201, the instructions, when executed by the at least one processor 201, cause the at least one processor 201 to perform the voltage measurement method described above.

Here, the memory and the processor are connected by means of a bus, wherein the bus may comprise any number of interconnected buses and bridges, the bus connecting various circuits of the one or more processors and the memory together. The bus may also connect together various other circuits, such as peripherals, voltage regulators, and power management circuits, all of which are well known in the art and therefore will not be described further herein. A bus interface provides an interface between the bus and a transceiver. The transceiver may be a single element or multiple elements, such as multiple receivers and transmitters, providing a unit for communicating with various other apparatuses over a transmission medium. Data processed by the processor is transmitted on a wireless medium over an antenna, and further, the antenna also receives the data and conveys the data to the processor.

The processor is responsible for bus managing and general processing, and may also provide various functions comprising timing, peripheral interface, voltage regulation, power management, and other control functions. In addition, the memory may be used for storing data that is used by the processor in performing operations.

Finally, it should be noted that the above embodiments are used only to illustrate, in stead of limiting, the technical solutions of the present application; although the present application is described in detail with reference to the preceding embodiments, it should be understood by those of ordinary skill in the art that: it is still possible to modify the technical solutions recorded in the preceding embodiments, or to equivalently replace some or all of the technical features; and these modifications or replacements do not make the essence of the corresponding technical solutions depart from the scope of the technical solutions of the embodiments of the present application, which should be covered by the scope of the claims and specification of the present application. In particular, the technical features mentioned in the various embodiments can be combined in any manner as long as there is no structural conflict. The present application is not limited to the specific embodiments disclosed herein, but rather includes all technical solutions falling within the scope of the claims.

The invention claimed is:

1. A voltage measurement circuit for measuring a voltage output by a battery, the battery comprising n battery cells connected in series, wherein n is an integer greater than 1; and the circuit comprising: n first measurement structures provided in one-to-one correspondence with the n battery cells, a first switching circuit, a second switching circuit, a reference voltage source, and a controller, wherein the reference voltage source is configured to output a preset reference voltage;

the two ends of each of the first measurement structures are connected to the two ends of a corresponding one of the battery cells via the first switching circuit, the two ends of each of the first measurement structures are further connected to the two ends of the reference voltage source via the second switching circuit, and the controller is connected to switchers in the first switching circuit and the second switching circuit, and the controller is further connected to each of the first measurement structures; and the controller is configured to control the switchers to be on or off and acquiring the voltages of the battery cells measured by the first measurement structures.

2. The voltage measurement circuit according to claim 1, wherein the first switching circuit comprises n+1 first switchers; and n−1 connection nodes formed by series connection of the n first measurement structures and the two ends of a branch circuit formed by series connection of the n first measurement structures are used as first connectable nodes, and n−1 connection nodes formed by series connection of the n battery cells and the two ends of a branch circuit formed by series connection of the n battery cells are used as second connectable nodes, the first connectable nodes being separately connected to corresponding ones of the second connectable nodes via the first switchers.

3. The voltage measurement circuit according to claim 2, wherein the second switching circuit comprises n+2 second switchers; and n−1 connection nodes formed by series connection of n second switchers and the two ends of a branch circuit formed by series connection of n second switchers are used as third connectable nodes, the first connectable nodes being separately connected to corresponding ones of the third connectable nodes via the second switchers, and the two ends of a branch circuit formed by series connection of the second switchers are further connected to the two ends of the reference voltage source via the second switchers.

4. The voltage measurement circuit according to claim 1, wherein the second switching circuit comprises 2n second switchers; and the two ends of each of the n first measurement structures are connected at the two ends of the reference voltage source via the second switchers.

5. The voltage measurement circuit according to claim 1, wherein the controller is configured to control switchers in the second switching circuit, so as to control switchers in the first switching circuit in the case where the first measurement structures are all disconnected from the reference voltage source, and to obtain voltages $U_1$, $U_2$, ..., and $U_n$ of the corresponding battery cells through measurement by the first measurement structures;

the controller is further configured to control the switchers in the first switching circuit, so as to control the switchers in the second switching circuit in the case where the first measurement structures are all disconnected from the battery cells, and to obtain voltages $V_1$, $V_2$, ..., and $V_n$ output by the reference voltage source through measurement by the first measurement structures, respectively; and the controller is further configured to calculate differences between $V_1$, $V_2$, ..., and $V_n$ and the preset reference voltage separately to obtain errors $\sigma v_1$, $\sigma v_2$, ..., and $\sigma v_n$ of the first measurement structures, and calibrate $U_1$, $U_2$, ..., and $U_n$ according to $\sigma v_1$, $\sigma v_2$, ..., and $\sigma v_n$ to obtain $U_1'$, $U_2'$, ..., and $U_n'$, and use $U_{sum}$ obtained by summing up $U_1'$, $U_2'$, ... and $U_n'$ as a voltage output by the battery that is obtained through measurement.

6. The voltage measurement circuit according to claim 5, wherein the voltage measurement circuit further comprises a second measurement structure, the two ends of the second measurement structure being connected to the two ends of the battery, and the controller being further connected to the second measurement structure;

the second measurement structure is configured to measure the voltage output by the battery to obtain $V_{total}$; and the controller is configured to use $U_{sum}$ as the voltage output by the battery that is obtained through measurement when $|V_{sum} - U_{sum}|$ total sum is greater than a permissible error of the second measurement structure.

7. The voltage measurement circuit according to claim 5, wherein the controller is further configured to calibrate $U_1$, $U_2$, ..., and $U_n$ according to the equation $U_n' = U_n - |\sigma v_n|$ when $|\sigma v_n| > \sigma$ allow and $\sigma v_n \geq 0$; calibrate $U_1$, $U_2$, ..., and $U_n$ according to the equation $U_n' = U_n + |\sigma v_n|$ when $|\sigma v_n| > \sigma_{allow}$ and $\sigma v_n < 0$; and set $U_n' = U_n$ when $\sigma v_n \leq \sigma_{allow}$, to obtain $U_1'$, $U_2'$, ..., and $U_n'$, wherein $\sigma_{allow}$ is a set permissible error of the first measurement structures.

8. The voltage measurement circuit according to claim 7, wherein the $\sigma_{allow}$ is the smaller one of a first permissible error and a second permissible error, wherein the first permissible error is the maximum permissible error of the first measurement structures modules and the second permissible error is $|\sigma v_{total}|/n$ and $|\sigma v_{total}|$ is the maximum permissible error of the second measurement structure.

9. The voltage measurement circuit according to claim 5, wherein the controller is further connected to the reference voltage source, and the controller is further configured to set the preset reference voltage $V_{REF} = (V_1 + V_2 + ... + V_n)/n$.

10. A circuit board, comprising the voltage measurement circuit of claim 1.

11. A voltage measurement method that is based on a controller in a voltage measurement circuit for measuring a voltage output by a battery, the battery comprising n battery cells connected in series, wherein n is an integer greater than 1, wherein the voltage measurement circuit comprising: n first measurement structures provided in one-to-one correspondence with the n battery cells, a first switching circuit, a second switching circuit, a reference voltage source, and a controller, wherein the reference voltage source is configured to output a preset reference voltage;

the two ends of each of the first measurement structures are connected to the two ends of a corresponding one of the battery cells via the first switching circuit, the two ends of each of the first measurement structures are further connected to the two ends of the reference voltage source via the second switching circuit, and the controller is connected to switchers in the first switching circuit and the second switching circuit, and the controller is further connected to each of the first measurement structures; and the controller is configured to control the switchers to be on or off and acquiring the voltages of the battery cells measured by the first measurement structures, the method comprising:

controlling switchers in the first switching circuit and the second switching circuit to be on or off, and acquiring voltages of battery cells that are measured by the first measurement structures.

12. The voltage measurement method according to claim 11, wherein the controlling switchers in the first switching circuit and the second switching circuit to be on or off, and acquiring voltages of battery cells that are measured by the first measurement structure comprises:

controlling the switchers in the second switching circuit, so as to control the switchers in the first switching circuit in the case where the first measurement structures are all disconnected from the reference voltage source, and to obtain voltages $U_1$, $U_2$, ..., and $U_n$ of corresponding battery cells through measurement by the first measurement structures; and the method further comprises:

controlling the switchers in the first switching circuit, so as to control the switchers in the second switching circuit in the case where the first measurement structures are all disconnected from the battery cells, and to obtain voltages $V_1, V_2, \ldots,$ and $V_n$ output by the reference voltage source through measurement by the first measurement structures, respectively; and calculating differences between $V_1, V_2, \ldots,$ and $V_n$ and a preset reference voltage output by the reference voltage source separately to obtain errors $\sigma v_1, \sigma v_2, \ldots,$ and $\sigma v_n$ of the first measurement structures;

calibrating $U_1, U_2, \ldots,$ and $U_n$ according to $\sigma v_1, \sigma v_2, \ldots,$ and $\sigma v_n$ to obtain $U_1', U_2', \ldots,$ and $U_n'$; and using $U_{sum}$ obtained by summing up $U_1', U_2', \ldots,$ and $U_n'$ as a voltage output by the battery that is obtained through measurement.

13. The voltage measurement method according to claim 12, wherein the voltage measurement circuit further comprises a second measurement structure, the two ends of the second measurement structure being connected to the two ends of the battery, and the controller being further connected to the second measurement structure, wherein the second measurement structure is configured to measure the voltage output by the battery to obtain $V_{total}$; and said using $U_{sum}$ obtained by summing up $U_1', U_2', \ldots,$ and $U_n'$ as a voltage output by the battery that is obtained through measurement comprises:

using $U_{sum}$ as the voltage output by the battery that is obtained through measurement when $|V_{total} - U_{sum}|$ is greater than a permissible error of the second measurement structure.

14. The voltage measurement method according to claim 12, wherein said calibrating $U_1, U_2, \ldots,$ and $U_n$ according to $\sigma v_1, \sigma v_2, \ldots,$ and $\sigma v_n$ to obtain $U_1', U_2', \ldots,$ and $U_n'$ comprises:

calibrating $U_1, U_2, \ldots,$ and $U_n$ according to the equation $U_n' = U_n - |\sigma v_n|$ when $|\sigma v_n| > \sigma_{allow}$ and $\sigma_{vn} \geq 0$;

calibrating $U_1, U_2, \ldots,$ and $U_n$ according to the equation $U_n' = U_n + |\sigma v_n|$ when $|\sigma v_n| > \sigma_{allow}$ and $\sigma_{vn} < 0$; and setting $U_n' = U_n$ when $|\sigma v_n| \leq \sigma_{allow}$ to obtain $U_1', U_2', \ldots,$ and $U_n'$, wherein $\sigma_{allow}$ is a set permissible error of the first measurement structures.

15. The voltage measurement method according to claim 14, wherein the $\sigma_{allow}$ is the smaller one of a first permissible error and a second permissible error, wherein the first permissible error is the maximum permissible error of the first measurement structures and the second permissible error is $|\sigma_{vtotal}|/n$ and $|\sigma_{vtotal}|$ is the maximum permissible error of the second measurement structure.

16. The voltage measurement method according to claim 12, wherein the controller is further connected to the reference voltage source, and the controller is further configured to set the preset reference voltage $V_{REF} = (V_1 + V_2 + \ldots + V_n)/n$.

17. A controller, comprising:

at least one processor; and a memory communicatively connected to the at least one processor, wherein the memory stores instructions executable by the at least one processor, the instructions, when executed by the at least one processor, cause the at least one processor to perform a voltage measurement method that is based on a controller in a voltage measurement circuit for measuring a voltage output by a battery, the battery comprising n battery cells connected in series, wherein n is an integer greater than 1, wherein the voltage measurement circuit comprising: n first measurement structures provided in one-to-one correspondence with the n battery cells, a first switching circuit, a second switching circuit, a reference voltage source, and a controller, wherein the reference voltage source is configured to output a preset reference voltage;

the two ends of each of the first measurement structures are connected to the two ends of a corresponding one of the battery cells via the first switching circuit, the two ends of each of the first measurement structures are further connected to the two ends of the reference voltage source via the second switching circuit, and the controller is connected to switchers in the first switching circuit and the second switching circuit, and the controller is further connected to each of the first measurement structures; and the controller is configured to control the switchers to be on or off and acquiring the voltages of the battery cells measured by the first measurement structures, the voltage measurement method comprising:

controlling switchers in the first switching circuit and the second switching circuit to be on or off, and acquiring voltages of battery cells that are measured by the first measurement structures.

* * * * *